United States Patent
Dewey, III et al.

(10) Patent No.: US 8,136,069 B2
(45) Date of Patent: Mar. 13, 2012

(54) ACCURATE APPROXIMATION OF RESISTANCE IN A WIRE WITH IRREGULAR BIASING AND DETERMINATION OF INTERCONNECT CAPACITANCES IN VLSI LAYOUTS IN THE PRESENCE OF CATASTROPHIC OPTICAL PROXIMITY CORRECTION

(75) Inventors: Lewis William Dewey, III, Wappingers Fall, NY (US); Ibrahim M. Elfadel, Cortlandt Manor, NY (US); David J. Widiger, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 358 days.

(21) Appl. No.: 12/423,387

(22) Filed: Apr. 14, 2009

(65) Prior Publication Data

US 2010/0262940 A1    Oct. 14, 2010

(51) Int. Cl.
 *G06F 9/455* (2006.01)
 *G06F 17/50* (2006.01)
(52) U.S. Cl. .................. 716/111; 716/53; 716/110
(58) Field of Classification Search .......... 716/53, 716/111
See application file for complete search history.

(56) References Cited

U.S. PATENT DOCUMENTS

| | | | |
|---|---|---|---|
| 5,706,206 A * | 1/1998 | Hammer et al. | 716/115 |
| 5,786,700 A | 7/1998 | Jen et al. | |
| 6,068,660 A * | 5/2000 | Lu | 703/2 |
| 6,086,238 A * | 7/2000 | Mehrotra et al. | 716/115 |
| 7,075,532 B2 | 7/2006 | Mukherjee et al. | |
| 7,340,356 B2 | 3/2008 | Straznicky | |
| 7,349,066 B2 * | 3/2008 | Eurlings et al. | 355/52 |
| 2006/0288316 A1 * | 12/2006 | Mack | 716/4 |
| 2007/0130551 A1 * | 6/2007 | Chen et al. | 716/5 |

OTHER PUBLICATIONS

Vancorenland et al., "A Layout-aware Synthesis Methodology for RF Circuits", IEEE/ACM International Conference on Computer Aided Design, 2001. ICCAD 2001, pp. 358-362.
Banerjee et al., "Analysis and Optimization of Thermal Issues in High-Performance VLSI", Proceedings of the 2001 International Symposium on Physical Design, Sonoma, CA, 2001, pp. 230-237.
Venkatraman et al., "Mitigating Static Power in Current-Sensed Interconnects", Proceedings of the 14th ACM Great Lakes symposium on VLSI Boston, MA, 2004, pp. 224-229.

* cited by examiner

*Primary Examiner* — Vuthe Siek
*Assistant Examiner* — Eric Lee
(74) *Attorney, Agent, or Firm* — Yee & Associates, P.C.

(57) ABSTRACT

The Width Bias Calculator (WBC) calculates electrical values by effectively averaging the electrical values to either side of a target wire shape whereby values are approximated for design validation without a significant impact on performance or memory consumption.

15 Claims, 12 Drawing Sheets

ACCURATE APPROXIMATION OF RESISTANCE IN A WIRE WITH IRREGULAR BIASING AND DETERMINATION OF INTERCONNECT CAPACITANCES IN VLSI LAYOUTS IN THE PRESENCE OF CATASTROPHIC OPTICAL PROXIMITY CORRECTION

BACKGROUND

1. Field

The disclosure relates generally to computer modeling of chip designs and more specifically to determination of resistance and parasitic capacitance by Design Automation Software Applications.

2. Description of the Related Art

Wire shapes in a wiring layout are defined with a certain width by the designer. However, due to modern chip fabrication processes, these widths do not always reflect the width of the actual wire after fabrication. This variance between design and fabrication width is referred to as width bias. The width bias, of a wire fabricated on a chip with the latest small wire geometry, has become dependent on the spacing to neighboring wires. In order to validate a design to the design specification, electrical values, such as parasitic capacitance and resistance values, must be calculated each time a change is made to a wiring layout.

In order to accurately calculate parasitic capacitance and resistance values, Design Automated Software Applications (DA applications) must correct for this width bias. In particular, those DA applications that extract electrical parasitic values often require large amounts of memory and processor resources because many of the calculations performed require design context data to account for contextually sensitive width biasing. An example of contextually sensitive width biasing can be seen in regard to isolated wires. CATastrophic Optical Proximity Correction (CATOPC), a DA application, widens isolated wires to make them easier to print. Therefore, isolated wires have more width variability than wires that are not isolated. The width variability caused by the widening requires calculations to account for the resulting width biasing. A known method to process contextually sensitive biasing is to store the effects by edge, rather than by wire. However, this method requires double the memory.

Each DA application modification to wiring creates a requirement for new biasing calculations. When the resistance or capacitance of a wire shape is affected by neighboring wire shapes so that performance of the wire shape is not within the required limits, a DA application adjusts the width of the wire shape to change the resistance or capacitance due to the neighboring wire shapes. Additionally, when the proximity of one wire to another could cause a short, the DA application adjusts the location of the wire to prevent the short. Each time the resistance or capacitance changes due to a bias, a DA application must determine the new electrical values in order to validate a design specification. DA applications can cause the bias of a wire shape to be a function of the distance to its neighbor on the same metal level. As a result, a particular wire shape segment may have several biasing variations along its length. The several biasing variations along the length are not necessarily aligned on the two sides of the wire shape. Furthermore, there may be a width-dependent bias that is applied after spacing-dependent biases are applied, implying that the bias on both sides must be known before the width-dependent bias can be determined. When the bias on both sides must be known before the width-dependent bias can be determined, the neighboring shapes on both sides of the wire shape must be known in order to determine the width of the wire shape prior to determining the processing bias.

In particular, this is the case for DA applications that examine the shapes of a design with a "scanline". A scanline is a line that sweeps from one side of the chip design to the other. As the scanline sweeps from one side of the chip design to the other, it identifies each wiring shape as it contacts each wiring shape. Therefore, a DA application employing a scanline can determine only one of the two possible distances to neighbors of a wire shape at any one time. To accurately determine the complete bias as discussed above, the spacing-dependent bias of both sides must be simultaneously known. Determining the spacing to one side and saving the spacing dependent bias for that side until the spacing to the other side is determined, creates a problem. The problem is that it may be too late for the DA application to calculate capacitance to the first neighboring shape because the first neighboring shape has been lost due to the examination process. Because of this effect, DA applications must consume considerable storage remembering the important information and sustain a performance loss organizing that information.

Therefore, a need exists for a way to reduce memory and performance consumption when calculating parametric electrical values due to width bias for design validation.

SUMMARY

According to one embodiment, when using a Design Automated Application (DA application) that is limited to determining one of two possible distances to a neighbor wire shape of a target wire shape in a chip design at any one time, an approximate electrical performance value for a target wire shape is determined to validate a design specification of the chip. The approximate electrical performance value is determined by calculating a first value using a first full bias for a first side of the target wire shape, and then independently calculating a second value using a second full bias for the second side of the target wire shape. The first value and the second value are combined to obtain the approximate electrical performance value. The approximate electrical performance value is used to validate a design specification of the chip.

In one embodiment, when the electrical performance value is a resistance value, a first spacing-dependent full bias for the first side is determined using a plurality of separations for one or more first side neighbor wire shapes. The first spacing-dependent full bias is used to compute a first target wire shape resistance. A second spacing-dependent full bias for the second side is determined using a plurality of second separations for one or more second side neighbor wire shapes. The second spacing-dependent full bias is used to compute a second target wire shape resistance. An approximate resistance value is calculated by averaging the first resistance value and the second resistance value. The approximate resistance value is used for a design validation.

In one embodiment, when the electrical performance value is a capacitance value, a first biased target wire shape capacitance is calculated by determining a first lateral capacitance, a first layer capacitance, and a second layer capacitance of a first neighbor on a first side of the target wire shape using a target wire shape width corrected with a first spacing-dependent full bias. A second biased target wire shape capacitance is calculated by determining a second lateral capacitance, a third layer capacitance to the first layer shape, and a fourth layer capacitance to the second layer shape of a second neighbor on a second side of the target wire shape using a second target wire shape width corrected with a second spacing-dependent full bias. The first layer capacitance, the second layer capacitance, the third layer capacitance and the fourth layer capacitance are averaged to get an approximate layer capacitance value. The first lateral capacitance value and the second lateral capacitance value are averaged to get an approximate lateral capacitance value. The sum of the approximate layer capacitance value and the approximate lateral capacitance value are used for design validation.

DETAILED DESCRIPTION

Figure 1:
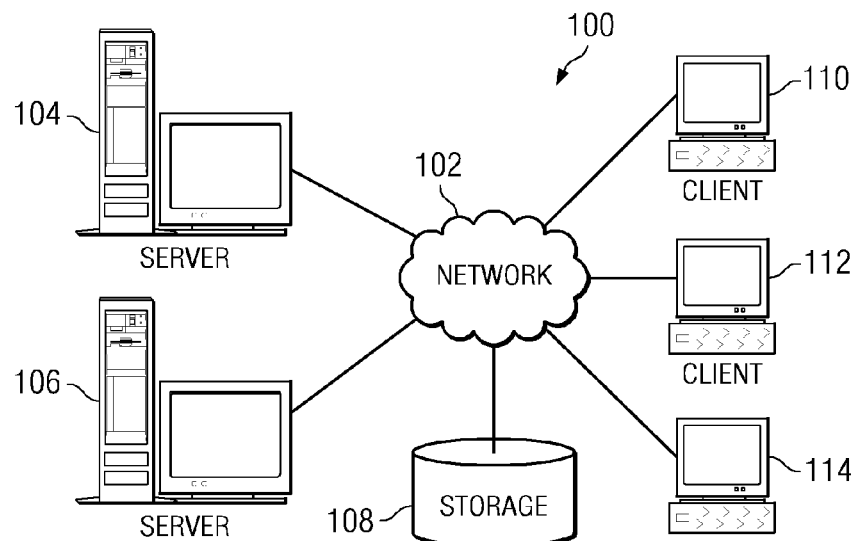
FIG. 1 is a server-client computer system.
Figure 2:
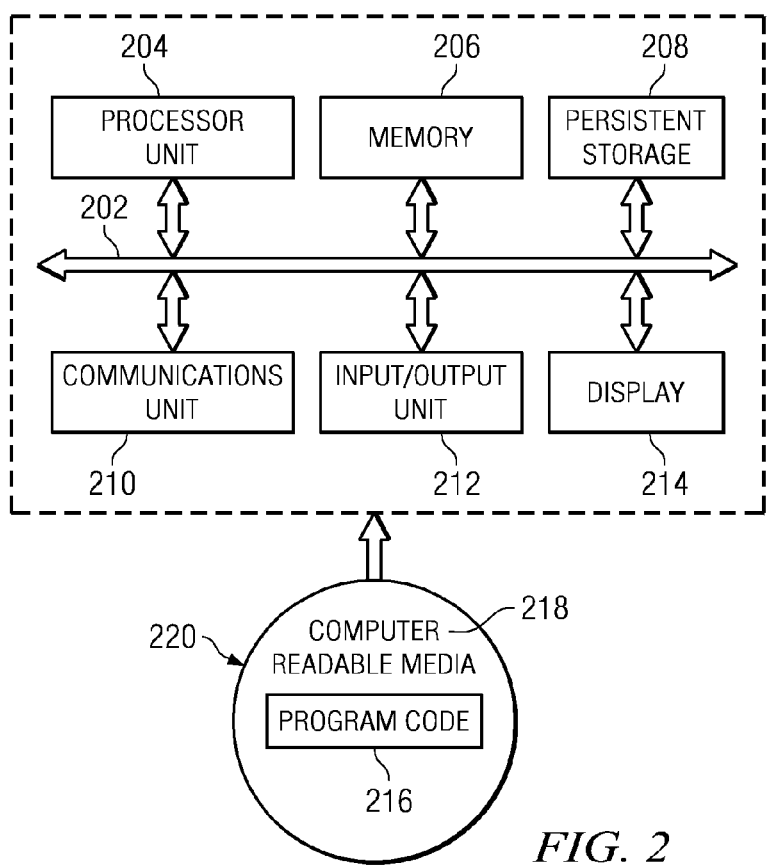
FIG. 2 is a computer framework.

With reference now to the figures, and in particular with reference to FIGS. 1-2, exemplary diagrams of data processing environments are provided in which illustrative embodiments may be implemented. It should be appreciated that FIGS. 1-2 are only exemplary and are not intended to assert or imply any limitation with regard to the environments in which different embodiments may be implemented. Many modifications to the depicted environments may be made.

FIG. 1 is a pictorial representation of a network of data processing systems in which illustrative embodiments may be implemented. Network data processing system 100 is a network of computers in which the illustrative embodiments may be implemented. Network data processing system 100 contains network 102, which is the medium used to provide communication links between various devices and computers connected together within network data processing system 100. Network 102 may include connections, such as wire, wireless communication links, or fiber optic cables.

In the depicted example, server 104 and server 106 connect to network 102 along with storage unit 108. In addition, clients 110, 112, and 114 connect to network 102. Clients 110, 112, and 114 may be, for example, personal computers or network computers. In the depicted example, server 104 provides data, such as boot files, operating system images, and applications to clients 110, 112, and 114. Clients 110, 112, and 114 are clients to server 104 in this example. Network data processing system 100 may include additional servers, clients, and other devices not shown.

Program code located in network data processing system 100 may be stored on a computer recordable storage medium and downloaded to a data processing system or other device for use. For example, program code may be stored on a computer recordable storage medium on server 104 and downloaded to client 110 over network 102 for use on client 110.

In the depicted example, network data processing system 100 is the Internet with network 102 representing a worldwide collection of networks and gateways that use the Transmission Control Protocol/Internet Protocol (TCP/IP) suite of protocols to communicate with one another. Of course, network data processing system 100 also may be implemented as a number of different types of networks, such as for example, an intranet, a local area network (LAN), or a wide area network (WAN). FIG. 1 is intended as an example, and not as an architectural limitation for the different illustrative embodiments.

With reference now to FIG. 2, a block diagram of a data processing system is shown in which illustrative embodiments may be implemented. The data processing system is an example of a computer, such as server 104 or client 110 in FIG. 1, in which computer-usable program code or instructions implementing the processes may be located for the illustrative embodiments. In this illustrative example, the data processing system includes communications fabric 202, which provides communications between processor unit 204, memory 206, persistent storage 208, communications unit 210, input/output (I/O) unit 212, and display 214.

Processor unit 204 serves to execute instructions for software that may be loaded into memory 206. Processor unit 204 may be a set of one or more processors or may be a multi-processor core, depending on the particular implementation. Further, processor unit 204 may be implemented using one or more heterogeneous processor systems in which a main processor is present with secondary processors on a single chip. As another illustrative example, processor unit 204 may be a symmetric multi-processor system containing multiple processors of the same type.

Memory 206 and persistent storage 208 are examples of storage devices. A storage device is any piece of hardware that is capable of storing information either on a temporary basis and/or a permanent basis. Memory 206, in these examples, may be, for example, a random access memory or any other suitable volatile or non-volatile storage device. Persistent storage 208 may take various forms depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 also may be removable. For example, a removable hard drive may be used for persistent storage 208.

Communications unit 210, in these examples, provides for communications with other data processing systems or devices. In these examples, communications unit 210 is a network interface card. Communications unit 210 may provide communications through the use of either or both physical and wireless communications links.

Input/output unit 212 allows for input and output of data with other devices that may be connected to the data processing system. For example, input/output unit 212 may provide a connection for user input through a keyboard and mouse. Further, input/output unit 212 may send output to a printer. Display 214 provides a mechanism to display information to a user.

Instructions for the operating system and applications or programs are located on persistent storage 208. These instructions may be loaded into memory 206 for execution by processor unit 204. The processes of the different embodiments may be performed by processor unit 204 using computer implemented instructions, which may be located in a memory, such as memory 206. These instructions are referred to as program code, computer-usable program code, or computer-readable program code that may be read and executed by a processor in processor unit 204. The program code in the different embodiments may be embodied on different physical or tangible computer-readable media, such as memory 206 or persistent storage 208.

Program code 216 is located in a functional form on computer readable media 218 that is selectively removable and may be loaded onto or transferred to the data processing system for execution by processor unit 204. Program code 216 and computer-readable media 218 form computer program product 220 in these examples. In one example, computer-readable media 218 may be in a tangible form, such as, for example, an optical or magnetic disc that is inserted or placed into a drive or other device that is part of persistent storage 208 for transfer onto a storage device, such as a hard drive that is part of persistent storage 208. In a tangible form, computer-readable media 218 also may take the form of a persistent storage, such as a hard drive, a thumb drive, or a flash memory that is connected to the data processing system. The tangible form of computer-readable media 218 is also referred to as computer-recordable storage media. In some instances, computer-recordable media 218 may not be removable.

Alternatively, program code 216 may be transferred to the data processing system from computer-readable media 218 through a communications link to communications unit 210 and/or through a connection to input/output unit 212. The communications link and/or the connection may be physical or wireless in the illustrative examples. The computer-readable media also may take the form of non-tangible media, such as communications links or wireless transmissions containing the program code.

In some illustrative embodiments, program code 216 may be downloaded over a network to persistent storage 208 from another device or data processing system for use within the data processing system. For instance, a program code stored in a computer readable storage medium in a server data processing system may be downloaded over a network from the server to the data processing system. The data processing system providing program code 216 may be a server computer, a client computer, or some other device capable of storing and transmitting program code 216.

The different components illustrated for the data processing system are not meant to provide architectural limitations to the manner in which different embodiments may be implemented. The different illustrative embodiments may be implemented in a data processing system including components in addition to, or in place of, those illustrated for the data processing system. Other components shown in FIG. 2 can be varied from the illustrative examples shown.

Figure 3:
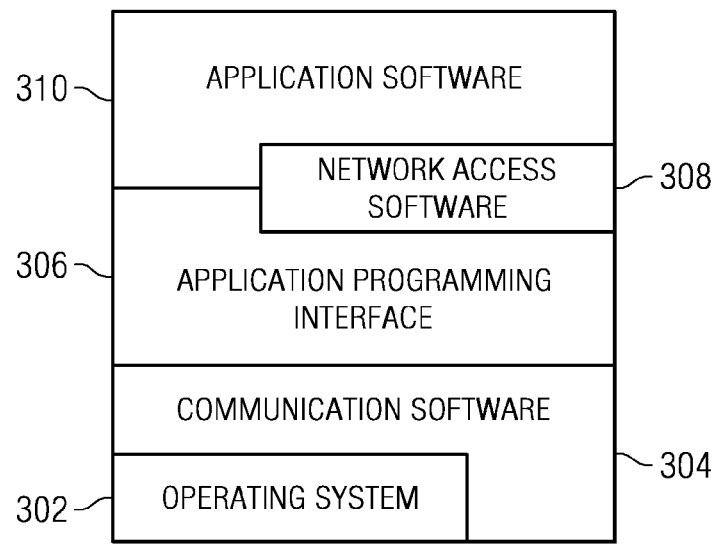
FIG. 3 is a software architecture for a server-client system containing application software.

Turning to FIG. 3, typical software architecture for a server-client system is depicted in accordance with an illustrative embodiment. At the lowest level, operating system 302 is utilized to provide high-level functionality to the user and to other software. Such an operating system typically includes a basic input/output system (BIOS). Communication software 304 provides communications through an external port to a network, such as the Internet, via a physical communications link by either directly invoking operating system functionality or indirectly bypassing the operating system to access the hardware for communications over the network.

Application programming interface (API) 306 allows the user of the system, such as an individual or a software routine, to invoke system capabilities using a standard consistent interface without concern for how the particular functionality is implemented. Network access software 308 represents any software available for allowing the system to access a network. This access may be to a network, such as a local area network (LAN), wide area network (WAN), or the Internet. With the Internet, this software may include programs such as Web browsers. Application software 310 represents any number of software applications designed to react to data through the communications port to provide the desired functionality the user seeks. Applications at this level may include those necessary to handle data, video, graphics, photos or text, which can be accessed by users of the Internet. Width Bias Calculator (WBC) 400 (see FIG. 4) may be implemented within communications software 304 in these examples.

Figure 4:
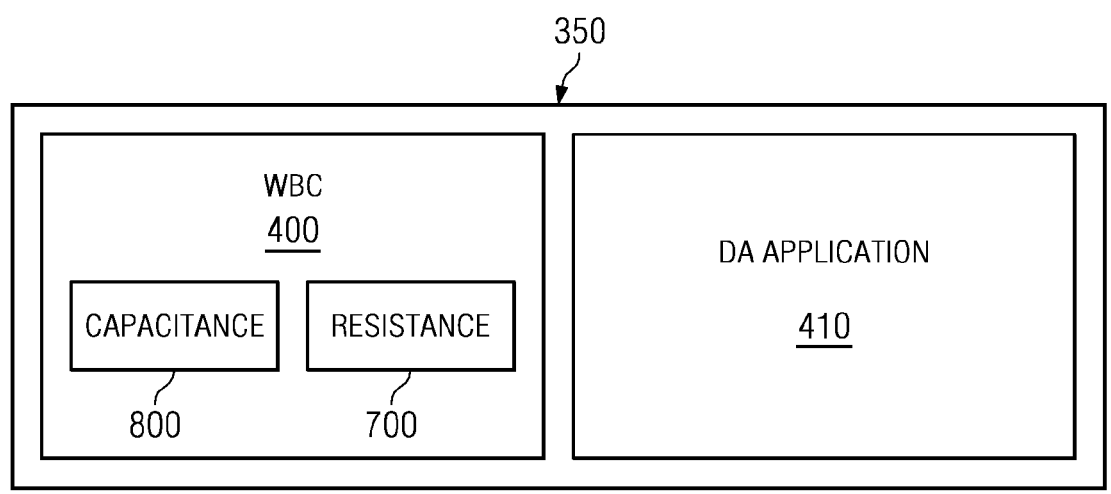
FIG. 4 is a memory containing elements of the application software.

FIG. 4 is an exemplary memory or storage 350 containing Width Bias Calculator (WBC) 400 and Design Automated Software Application (DA application) 410. WBC 400 has capacitance component 800 and resistance component 700.

Figure 5A:
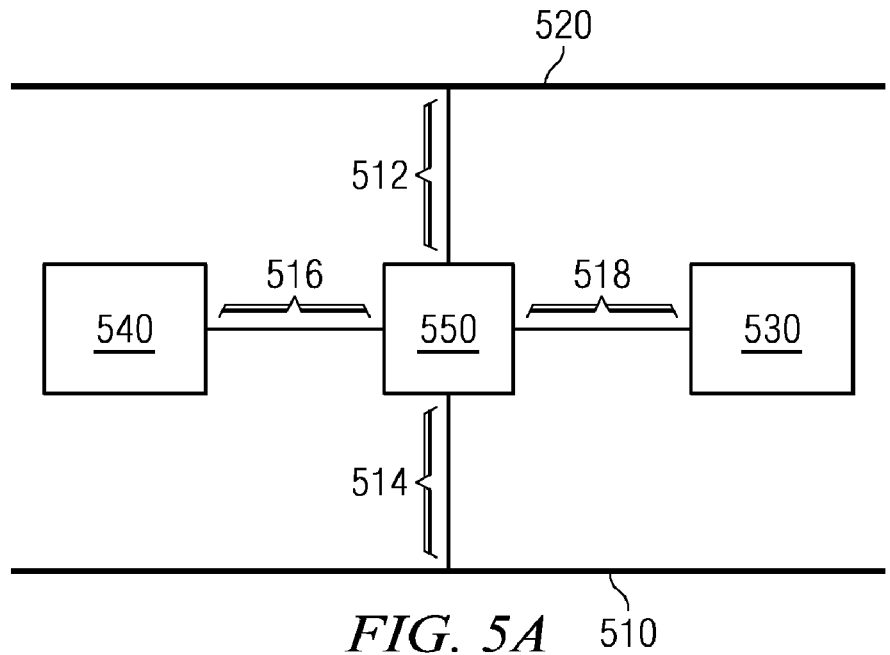
FIG. 5A is a view of a target wire shape for resistance calculations.
Figure 5B:
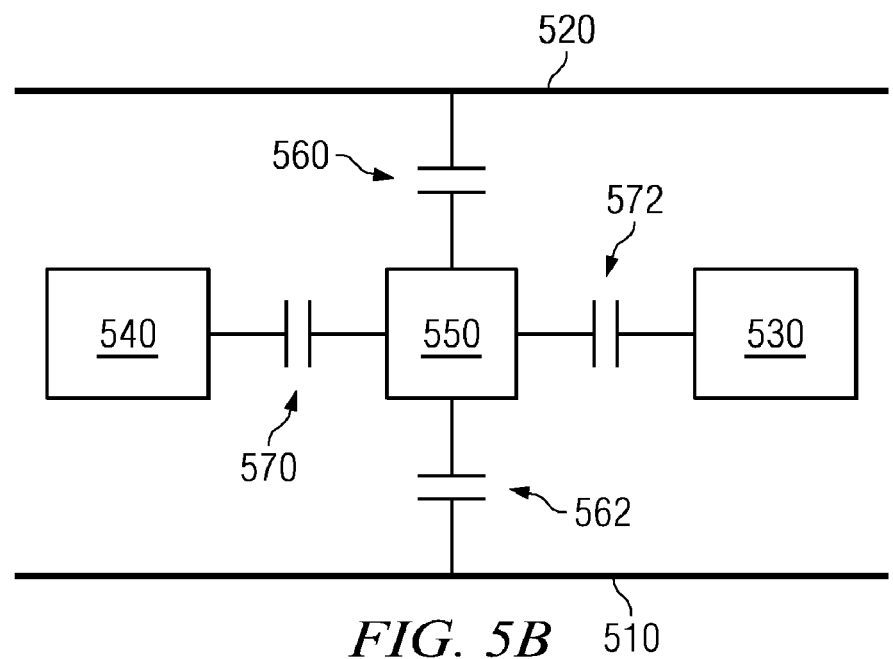
FIG. 5B is a view of a target wire shape for capacitance calculations.

Referring to FIG. 5A, wire shape segment consisting of rectangular wire shape 550, left neighbor 540, and right neighbor 530 is shown. Rectangular wire shape 550 is separated from left neighbor 540 by first distance 516. Rectangular wire shape 550 is separated from right neighbor 530 by second distance 518. Rectangular wire shape 550 is separated from first top level 520 by third distance 512 and from bottom level 510 by fourth distance 514. First distance 516 and second distance 518 are relevant to resistance calculations. First distance 516, second distance 518, third distance 512, and fourth distance 514 are relevant to capacitance calculations. FIG. 5B illustrates the capacitance between rectangular wire shape 550, top level 520, bottom level 510, left neighbor 540, and right neighbor 530. First layer capacitance 560 is between rectangular wire shape 550 and top level 520. Second layer capacitance 562 is between rectangular wire shape 550 and bottom level 510. Third layer capacitance 570 is between rectangular wire shape 550 and left neighbor 540. Fourth layer capacitance 572 is between rectangular wire shape 550 and right neighbor 530. The example of FIG. 5A and FIG. 5B is a simplified example. Wire shapes can have multiple neighbors. In addition, a target wire shape such as rectangular wire shape 550 can have different run lengths in relation to each of its neighbors. The effect of run lengths and multiple neighbors will be discussed in FIG. 6A through FIG. 6G.

Figure 6A:
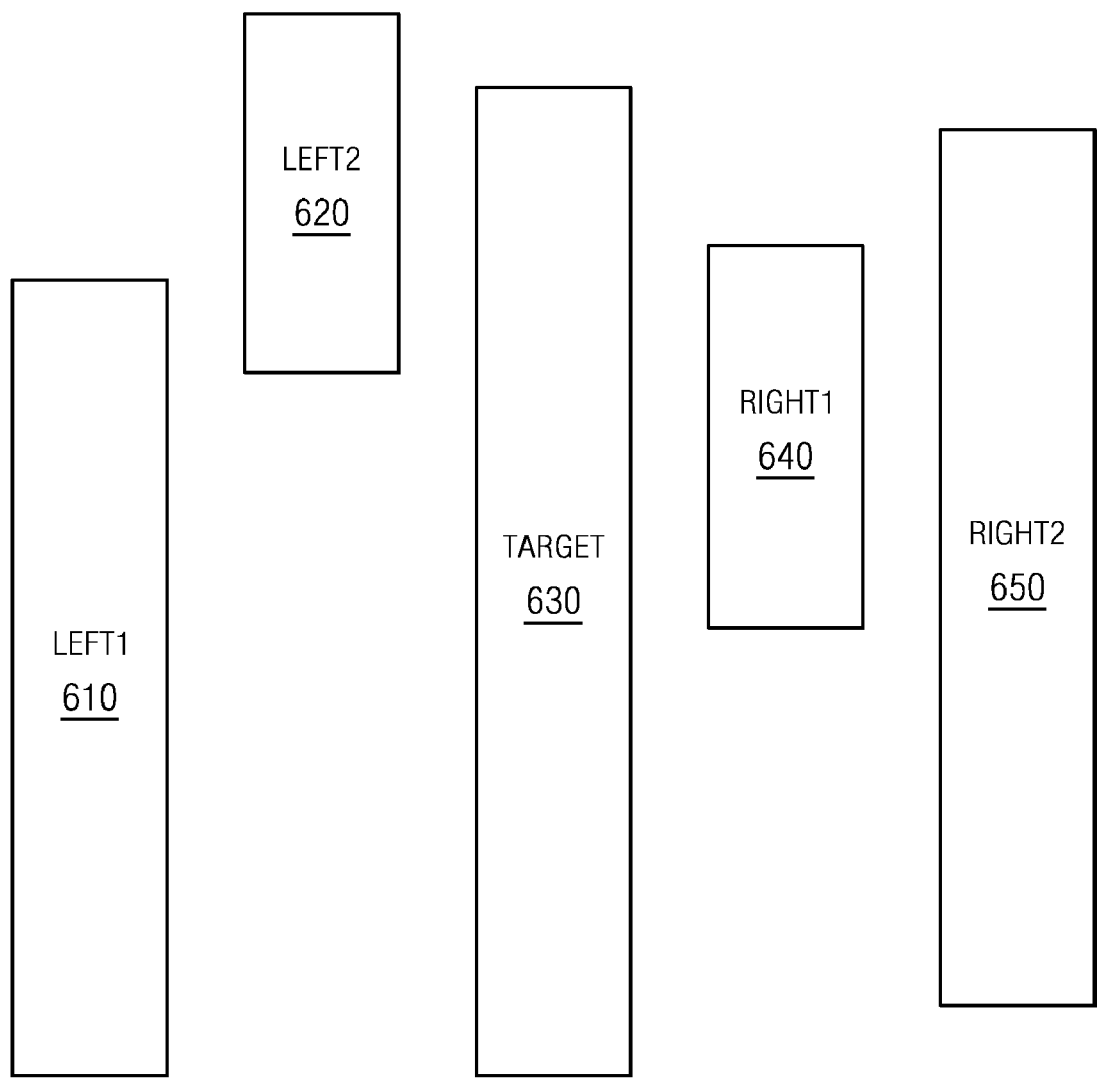
FIG. 6A is a lateral view of a target wire shape and neighbors.
Figure 6B:
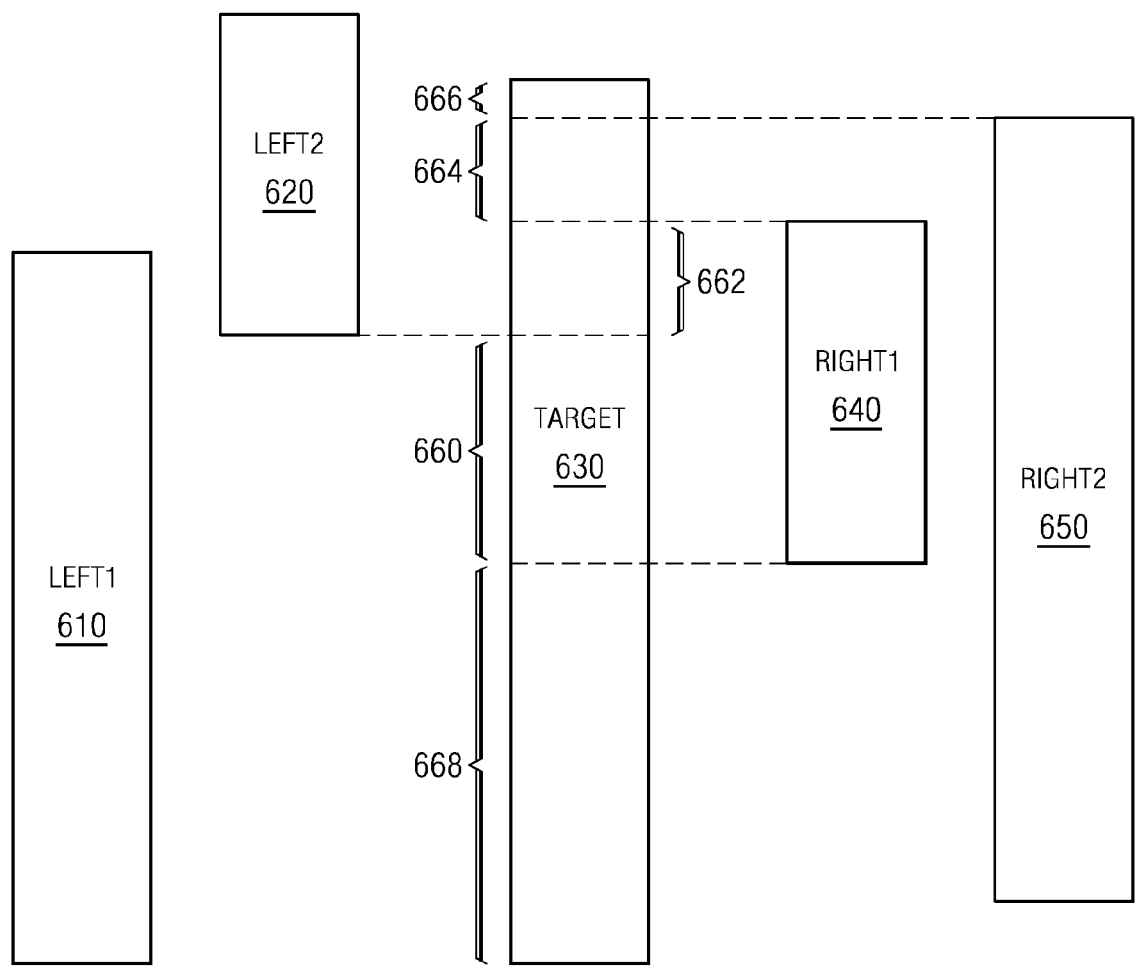
FIG. 6B is a lateral view of target segments.
Figure 6C:
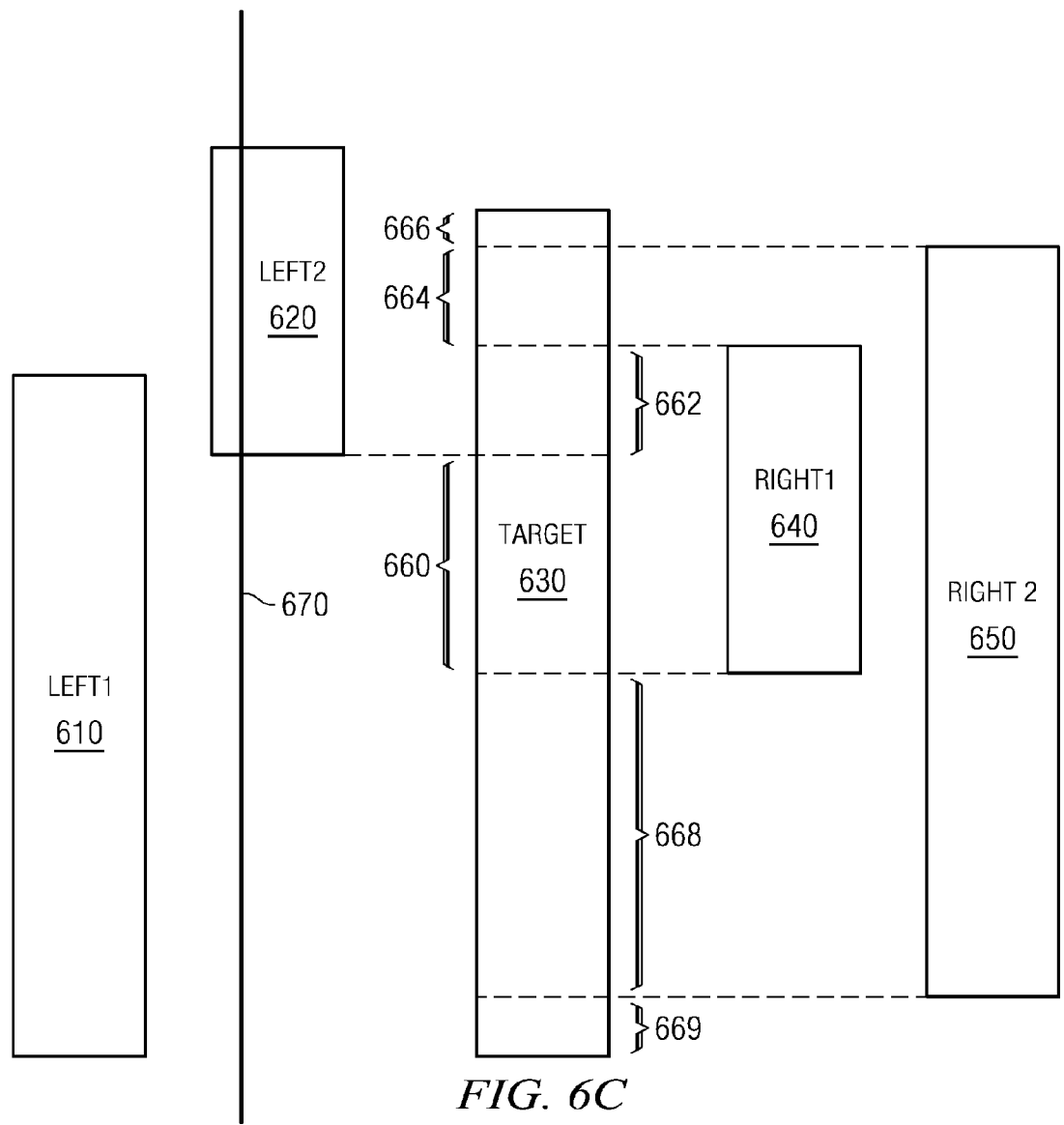
FIG. 6C is an exemplary examination line history.

FIG. 6A is a target wire shape 630. Target wire shape 630 has a top level and bottom level as shown for rectangular wire shape 550 in FIG. 5A, but the top level and the bottom level will be discussed below only in regard to capacitance. Target 630 has first left neighbor 610, second left neighbor 620, first right neighbor 640, and second right neighbor 650. As shown in FIG. 6A, not only do the distances vary between target wire shape 630 and its neighbors, but one neighbor wire shape can intervene between another neighbor wire shape and target wire shape 630. Referring to FIG. 6B, a run length of target wire shape 630 is represented by first wire shape segment 666, second wire shape segment 664, third wire shape segment 662, fourth wire shape segment 660, and fifth wire shape segment 668. First wire shape segment 666 is affected by second left wire shape 620 only. Second wire shape segment 664 is affected by second right neighbor 650 and second left neighbor 620. Third wire shape segment 662 is affected by first left neighbor 610, second left neighbor 620, first right neighbor 640 and second right neighbor 650. Fourth wire shape segment 630 is affected by first left neighbor 610, first right neighbor 640, and second right neighbor 650. Fifth wire shape segment 668 is affected by first left neighbor 610 and second right neighbor 650. Thus, as will be discussed further, below resistance and capacitance calculations can be made by wire shape segment and then adding the values for the segments.

Figure 6D:
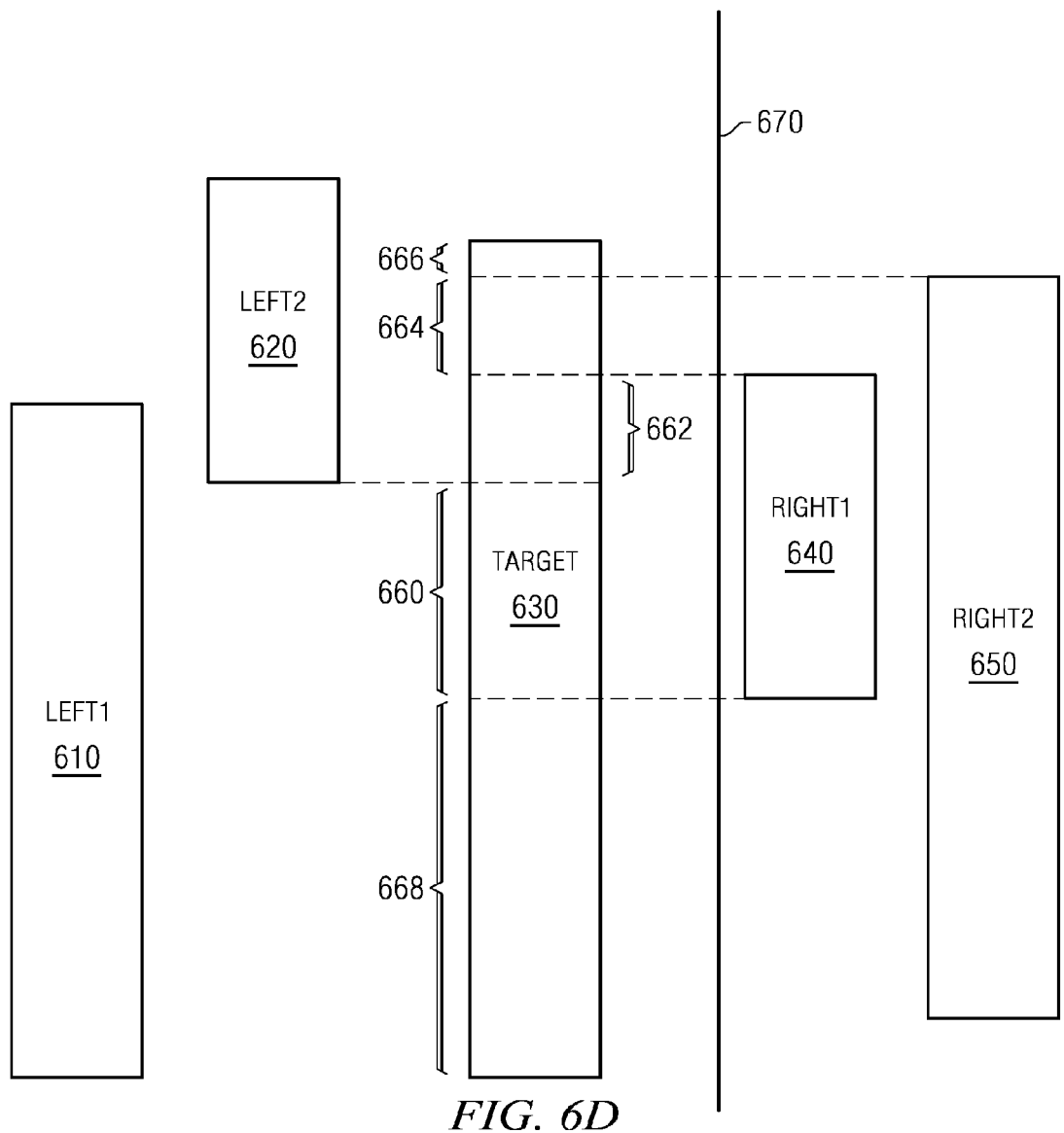
FIG. 6D is a further exemplary examination line history.
Figure 6E:
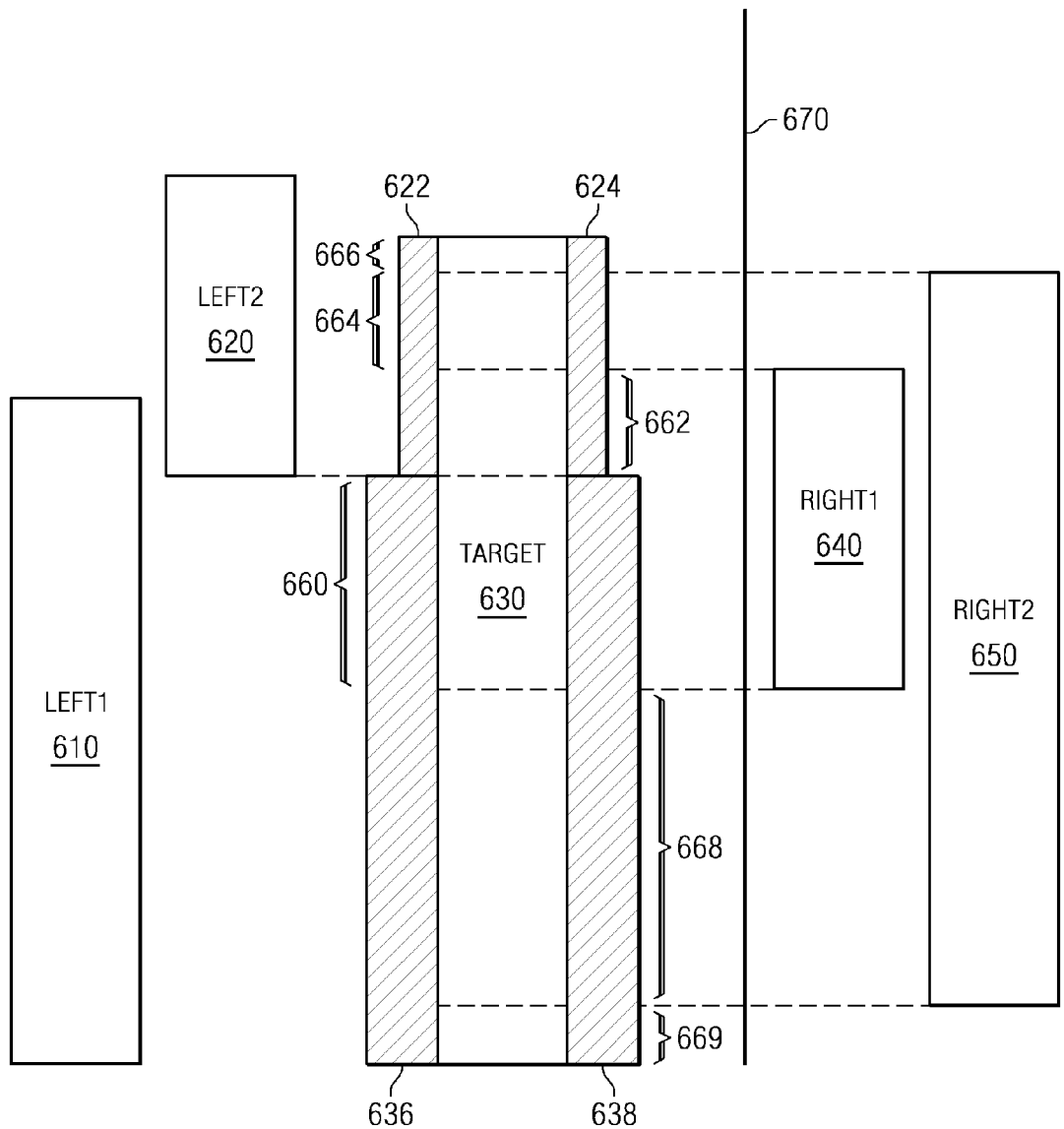
FIG. 6E is a first spacing-dependent width bias.

Persons skilled in the art are aware of multiple methods of examining wire shapes in a chip design. In one embodiment, a scanline is used when a scanline is employed by a DA application, the position of the scanline determines what information regarding target wire shape 630 is available for storage and processing. For example, referring to FIG. 6C, scanline 670 is shown passing over second left neighbor 620 and having previously passed over first left neighbor 610. Thus, distances of first left neighbor 610 and second left neighbor 620 from target wire shape 630 are not yet determined. Referring to FIG. 6D, scanline 670 has passed over first left neighbor 610, second left neighbor 620 and target wire shape 630. Hence, distances from target wire shape 630 to those neighbors are determined, and width biases can be calculated for the effect of first left neighbor 610 and second left neighbor 620 on target wire shape 630. These width biases are shown in FIG. 6E. However, distances to first right neighbor 640 and second right neighbor 650 are not yet determined. Therefore, first width bias 622 and second width bias 624 are shown by shading and are meant to depict the extension of the width of target wire shape 630 along first wire shape segment 666, second wire shape segment 664, and third wire shape segment 662 due to first left neighbor 610 and second left neighbor 620. Likewise, third width bias 636 and fourth width bias 638 are shown by shading and are meant to depict the extension of the width of target wire shape 630 along fourth wire shape segment 660, fifth wire shape segment 668 and sixth wire shape segment 669 due to first left neighbor 610 and second left neighbor 620.

Figure 6F:
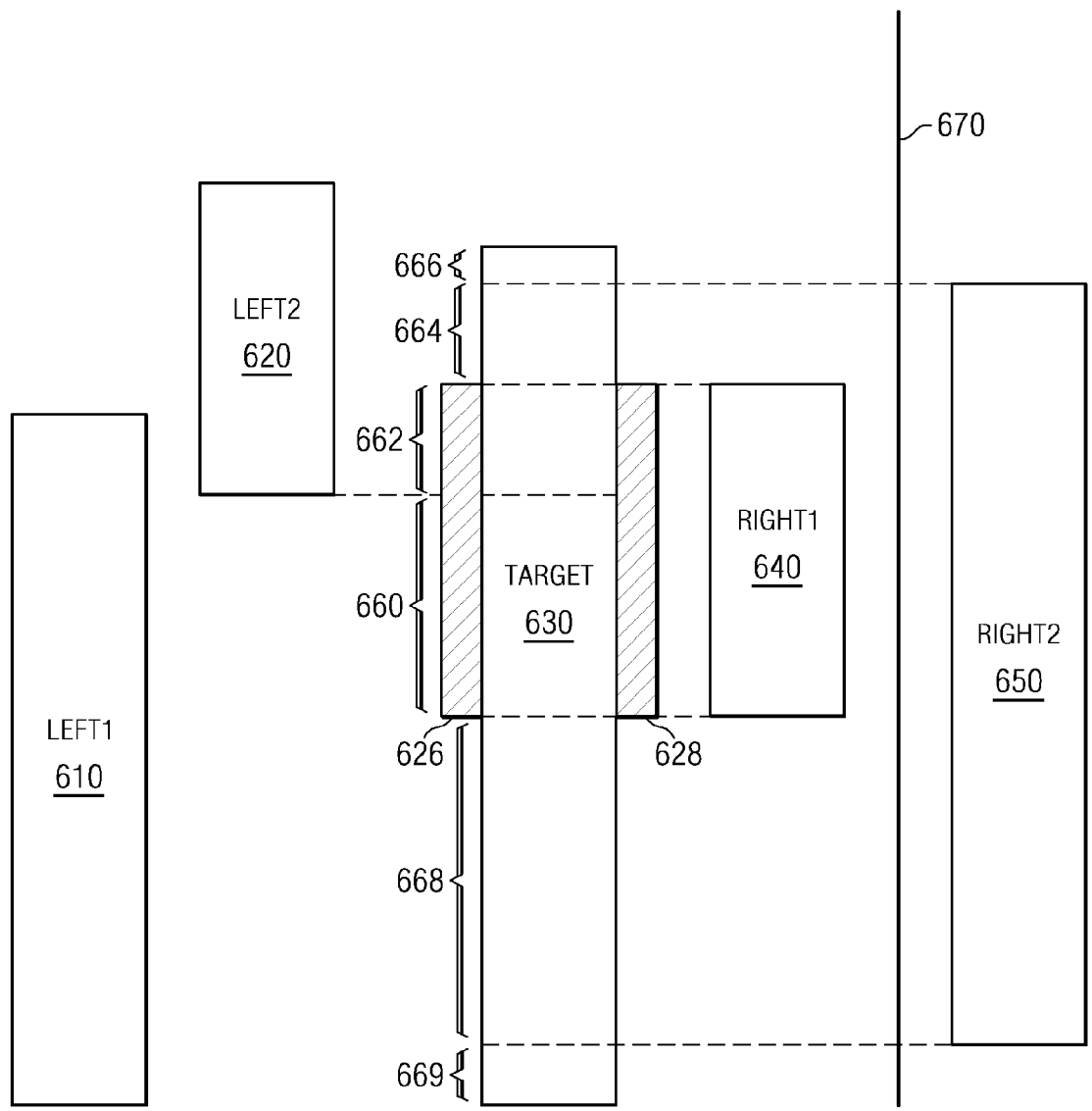
FIG. 6F is a second spacing-dependent width bias.
Figure 6G:
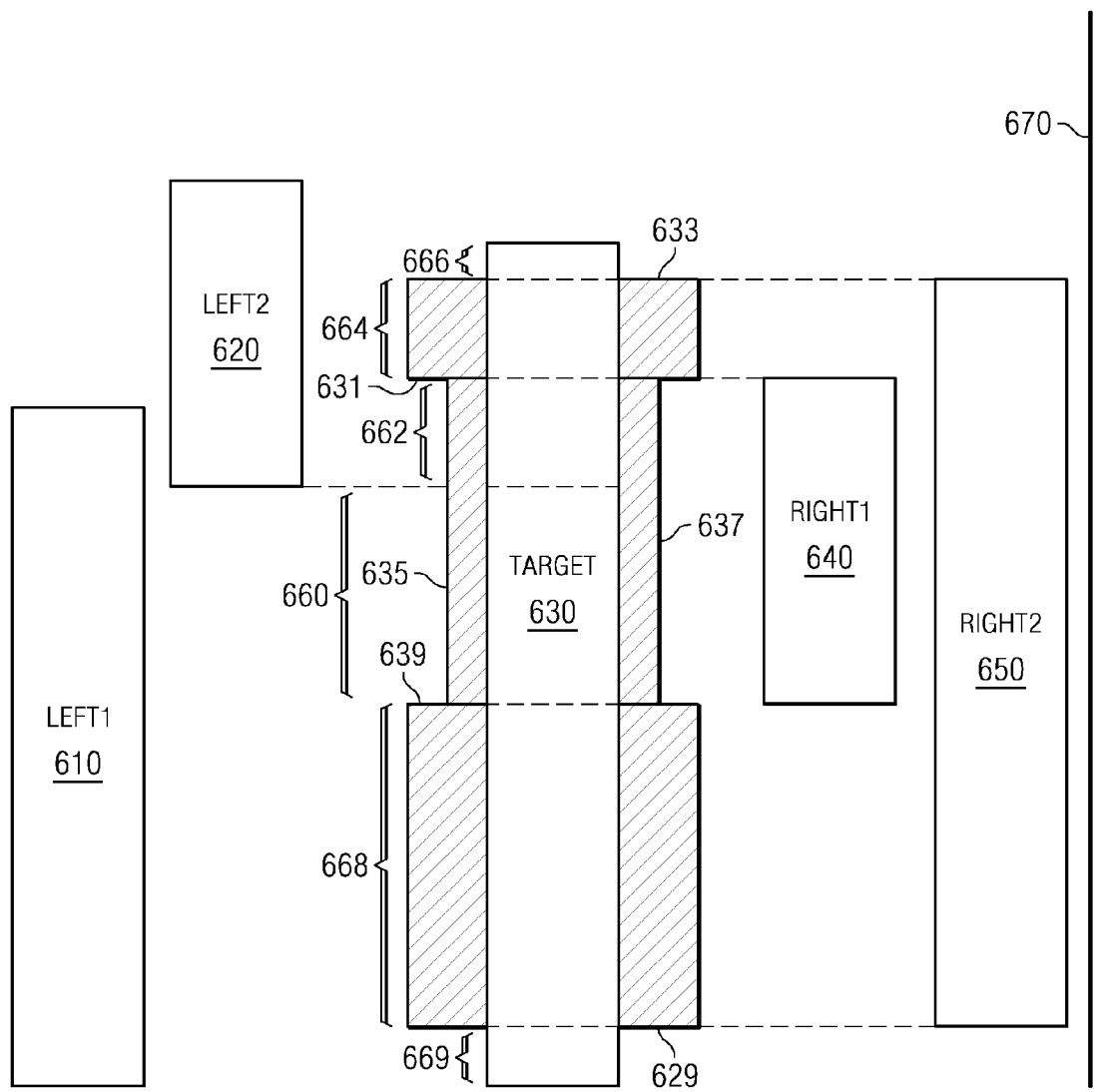
FIG. 6G is a third spacing-dependent width bias.

FIG. 6F is a width bias when scan line 670 moves past first right neighbor 640. Fifth width bias 626 and sixth width bias 628 are meant to depict the extension of the width of target wire shape 630 along third wire shape segment 662 and fourth wire shape segment 660. As can be seen, the passage of scan line 670 beyond first right neighbor 640 has significantly changed the width bias applied to target wire shape 630. In addition, the segments of the run length of target wire shape 630 to which a width bias is applied changes. Referring to FIG. 6G, scanline 670 has passed second right neighbor 650 and the effects of all four neighbors to target wire shape 630 can be applied. Seventh width bias 631 and eighth width bias 633 are applied along second wire shape segment 664. Ninth width bias 635 and tenth width bias 637 are applied along third wire shape segment 662, fourth wire shape segment 660, and fifth wire shape segment 668. FIG. 6A through FIG. 6G are meant to show the changes in width bias that occurs when a DA application passes a scanline from left to right over a target wire shape and its neighbors. The example is limited to a simple case, but in practice, the chip design contains thousands of wire shapes having thousands of combinations of neighbor shapes with width biases changing in response to each change in a wire shape. The thousands of wire shapes can be listed. Width Bias Calculator (WBC) 400 (see FIG. 4) is designed to reduce the resources needed to perform calculation by a DA application. The principles of operation of WBC 400 are set forth below.

Resistance

Resistance component 430 of WBC 400 uses the following procedure to determine the approximate resistance of the wire shape.

1. Select a target wire shape and examine each neighbor. Examination can be conducted by a scanline; however, other methods of examination are known to persons skilled in the art.
2. For each left neighbor, determine the distance separations to each left neighbor.
3. Using the left neighbor separations, determine the spacing-dependent bias symmetrically along each segment of the target wire shape. The bias is assumed to apply to both sides, so that the full bias is determined. Spacing-dependent bias is determined by moving a left edge and right edge of a target wire shape outward along a wire shape segment. The segments are determined by the length of the neighbor as shown in FIGS. 6A through 6F.
4. Compute the target wire resistance with bias for the left side.
5. For each right neighbor, determine the distance separations to each right neighbor.
6. Using the right neighbor separations, determine the spacing-dependent bias symmetrically along each segment of the target wire shape. The bias is assumed to apply to both sides, so that the full bias is determined. Spacing-dependent bias is determined by moving a left edge and right edge of a target wire shape outward along a wire shape segment. The segments are determined by the length of the neighbor as shown in FIGS. 6A-6F.
7. Compute the target resistances (with bias) for the right side.
8. Add the resistances for each segment to obtain a total resistance value for each side.
9. Average the resistance value for the left side and the right side.

The resistance determined above is accurate to the first order of a Taylor series expansion. This is done using the Taylor series expansion as follows, for the exact case:

k=index of a wire shape segment of the total wire length
w0=nominal width
Wire thickness does not change.

When the effects on each side were symmetric, the resistance predicted above is $$R=\text{resistivity}*\text{sum}(k)[\text{length}(k)/\text{width}(k)]$$

where $$\text{width}(k)=w0+2*d\text{bias}(k)+\text{bias}(w0+2*d\text{bias}(k))$$

where dbias(k) is the change in bias on one side of the wire due to neighboring wires, and bias(x) is a function that corrects the bias after the neighbor effects are applied.

In actuality, the bias may be different on each side in an unpredictable way:

$$R=\text{resistivity}*\text{sum}(k)[\text{length}(k)/\text{width}(k)]$$

where $$\text{width}(k)=w0+d\text{bias}1(k)+d\text{bias}r(k)+\text{bias}(w0+d\text{bias}1(k)+d\text{bias}r(k)), \text{ and}$$

where dbias1($k$) and dbiasr(k) are the changes in bias due to the left and right neighbors respectively.

The total bias function, bias( ), can be expanded to its linear part:

$$\text{bias}(w0+\text{delta}w)=\text{bias}(w0)+\text{bias}1(w0)*\text{delta}w$$

It is shown that the two calculations of R are equal to the first order of the Taylor series expansion.

Expanding the exact formulation and dropping second-order terms, $$R = \text{resistivity} * \text{sum}(k)[\text{length}(k)/(w0 + d\text{bias}1(k) + d\text{bias}r(k) + \text{bias}(w0) + \text{bias}1(w0) * d\text{bias}1(k) + \text{bias}1(w0) * d\text{bias}r(k))] = \text{resistivity} * \text{sum}(k)[(\text{length}(k)/w0) * (1 - d\text{bias}1(k)/w0 - d\text{bias}r(k)/w0 - \text{bias}(w0)/w0 - \text{bias}1(w0)/w0 * d\text{bias}1(k) - \text{bias}1(w0)/w0 * d\text{bias}r(k))].$$

By summing each of dbias1 and dbiasr individually, $$R = \text{resistivity} * L/w0 * (1 - \text{bias}(w0)/w0) - (\text{resistivity}/(w0*w0)) * (1 + \text{bias}1(w0)) * \text{sum}(k)[\text{length}(k) * d\text{bias}1(k)] - (\text{resistivity}/(w0*w0)) * (1 + \text{bias}1(w0)) * \text{sum}(k)[\text{length}(k) * d\text{bias}r(k)],$$

where L=sum(k)[length(k)].

Similarly, for the approximate process presented here, $$R = 0.5 * \text{resistivity} * \text{sum}(k)[\text{length}(k)/(w + 2 * d\text{bias}(k) + \text{bias}(w0) + \text{bias}1(w0) * 2 * d\text{bias}(k))]$$
$$= 0.5 * \text{resistivity} * \text{sum}(k)[(\text{length}(k)/w0) * (1 - 2 * d\text{bias}(k)/w0 - \text{bias}(w0)/w0 - \text{bias}1(w0)/w0 * 2 * d\text{bias}(k))] = 0.5 * \text{resistivity} * 2 * L/w0 * (1 - \text{bias}(w0)/w0) - 0.5 * \text{resistivity}/(w0*w0) * (1 + \text{bias}1(w0)) * \text{sum}(k)[\text{length}(k) * 2 * d\text{bias}(k)]$$
$$= \text{resistivity} * L/w0 * (1 - \text{bias}(w0)/w0) - (\text{resistivity}/(w0*w0)) * (1 + \text{bias}1(w0)) * \text{sum}(k)[\text{length}(k) * d\text{bias}(k)],$$

except that the sum over k here is along each side of the wire in sequence, hence L=0.5*sum(k)[length(k)].

Since the sum over k in the approximate case contains both the left and right biases, this sum matches the sum of the sums of dbias1 and dbiasr in the exact case. Hence, the two results are equal and, thus, the resistances for the exact case and the approximate case presented here are equal to the first order of the Taylor series expansion.

Capacitance

Capacitance component 420 of WBC 400 limits error in the capacitance calculation based only on the spacing on one side of the target to second order error. Capacitance component 420 of WBC 400 interacts with the DA application to calculate the width bias as follows:

1. When determining parasitic capacitance which is considered to be on only one side of the wire shape, and only the neighboring shape on that side is known, determine the spacing-dependent bias assuming that the correction is the same on both sides of the wire shape.
2. Select a target wire shape.
3. For each left neighbor, determine the separation distances.
4. Determine the full width bias correction using the above wire shape width corrected for left separations. This implicitly assumes that the same spacing-dependent bias applies to both sides of the wire shape.
5. Determine a left side lateral target wire capacitance.
6. Determine the top layer and bottom layer capacitance based on the corrected width, the correction of which would affect the capacitance to the neighbor and above-below shapes. For the assumed case where each side of the wire shape was to be analyzed at separate occasions, the up-down cap would be only for the portion of the wire shape under consideration at the time—the remainder of the up-down capacitance would be determined at the time of the analysis of the other side of the wire shape.
7. Repeat 1), 2), 3), 4), 5) and 6) for the right side of the wire shape.
5. Combine the two results by averaging the up-down capacitance values. Average the lateral capacitances for neighbor shapes on either side. Thus, total capacitance is the sum of the average up-down capacitances and the average of the lateral capacitances. The up-down capacitance values are the values for the distance between the target wire shape and the top layer value and the distance between the target wire shape and the bottom layer. The lateral capacitance values are the values for the distance between the target wire shape and the left neighbor and the values for the distance between the target wire shape and the right neighbor.

The vertical capacitance to first order of the Taylor series expansion varies linearly with the width of the wire shape.

$$C\text{vert} = Cv0 + Cv1 * \text{delta-}w$$

The lateral capacitance varies to the first order of the Taylor series expansion with the inverse of the distance to the neighbor which depends on the width of the wire shape. To the first order of the Taylor series expansion, the lateral capacitance varies linearly with the width of the wire shape, since $$C\text{lat} = C10 + C11/(\text{dist} + \text{delta-}w) \sim = C10 - C11 * \text{delta-}w.$$

As wire shapes get further apart, this method gives a conservative estimate because lateral capacitance becomes less significant.

Thus, capacitance to first order is linear with the width of the wire shape. For the exact case where the bias on each side of the wire shape is known and may be different, the width after biasing is $$w' = \text{delta-}w(w) + w$$

where delta-w (width) is the operation that gives the final bias, and w0 is the width adjusted for spacing dependencies.

$$w = w0 + w\text{-leftbias} + w\text{-rightbias}$$

delta-w(w) can be expanded as delta-w(w)=A0+A1*w+second-order terms Thus, to first order, $$w' = A0 + A1 * (w0 + w\text{-leftbias} + w\text{-rightbias}) + w0 + w\text{-leftbias} + w\text{-rightbias}$$

The vertical capacitance is then $$C\text{vert} = Cv0 + Cv1 * (A1 * (w0 + w\text{-leftbias} + w\text{-rightbias}) + w\text{-leftbias} + w\text{-rightbias}) = Cv0 + Cv1 * A1 * w0 + Cv1 * (A1 + 1) * w\text{-leftbias} + Cv1 * (A1 + 1) * w\text{-rightbias}.$$

For the approximate case described above, $$w\text{left}' = A0 + A1 * (w0 + 2 * w\text{-leftbias}) + w0 + 2 * w\text{-leftbias}$$

$$w\text{right}' = A0 + A1 * (w0 + 2 * w\text{-rightbias}) + w0 + 2 * w\text{-rightbias}$$

$$C\text{vertleft} = Cv0 + Cv1 * A1 * w0 + 2 * Cv1 * (A1 + 1) * w\text{-leftbias}$$

$$C\text{vertright} = Cv0 + Cv1 * A1 * w0 + 2 * Cv1 * (A1 + 1) * w\text{-rightbias}$$

$$C\text{vert} = 0.5 * (C\text{vertleft} + C\text{vertright}) = Cv0 + Cv1 * A1 * w0 + Cv1 * (A1 + 1) * w\text{-leftbias} + Cv1 * (A1 + 1) * w\text{-rightbias},$$

which matches the exact case. Therefore, using the above approximation, to first order, the capacitance is the same.

Figure 7:
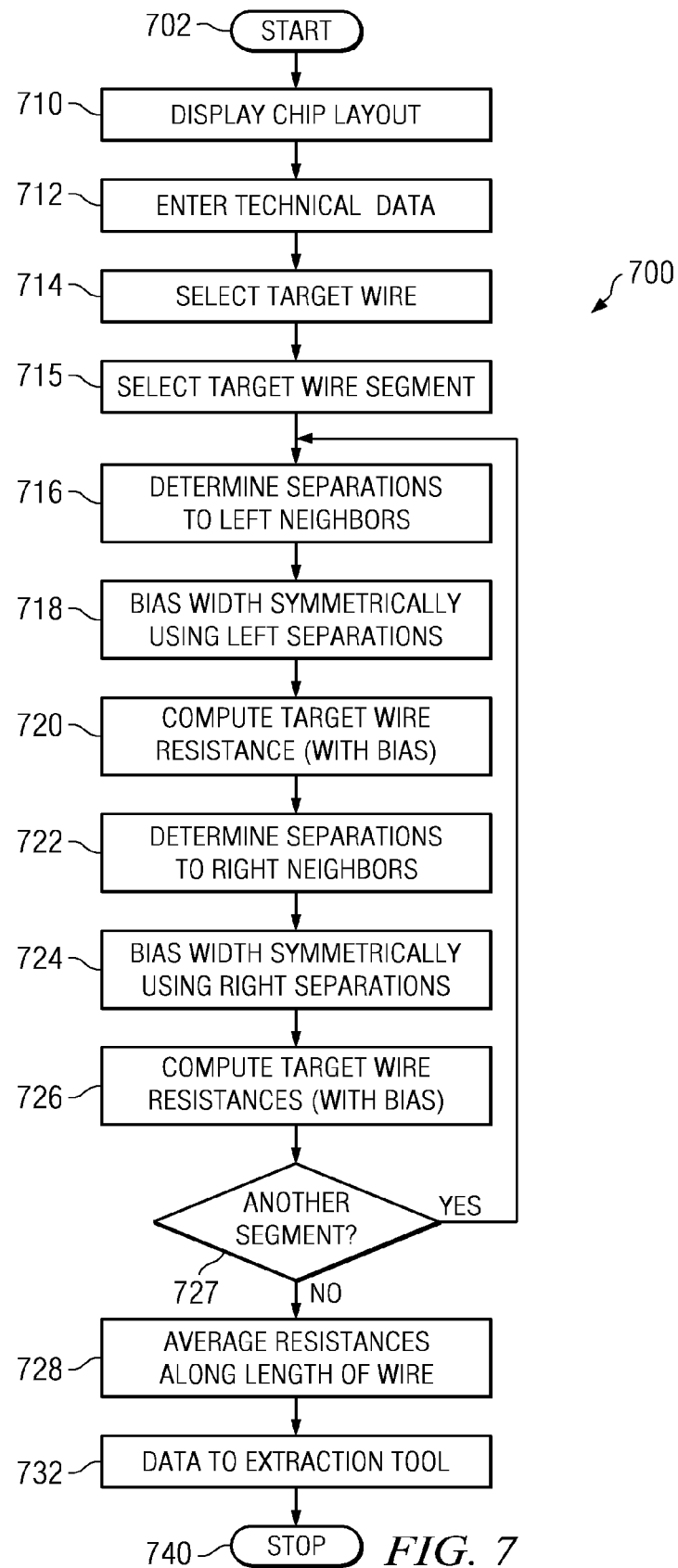
FIG. 7 is a flowchart of a resistance correction algorithm.

FIG. 7 is a flowchart of resistance module 700. Resistance Module 700 starts (step 702) and displays the chip layout (step 710). Technical data is entered (step 712), and the target wire shape selected (step 714). A target wire shape segment is selected (step 715). Separation distances from left neighbors are determined (step 716) and width is biased symmetrically using the left separations (step 718). Target wire shape resistances are computed with the bias (step 720). Next, separations distances are determined from the right neighbors (step 722). Width is biased symmetrically using the right neighbor separation distances (step 724). Target wire shape resistances are computed with bias (step 726). A determination is made whether there is another segment (step 727). When there is another segment, resistance module 700 goes to step 716.

When there is not another segment, average resistances are computed along the length of the wire shape (step 728). The data is sent to the DA application (step 732), and resistance module 700 stops (step 740).

Figure 8:
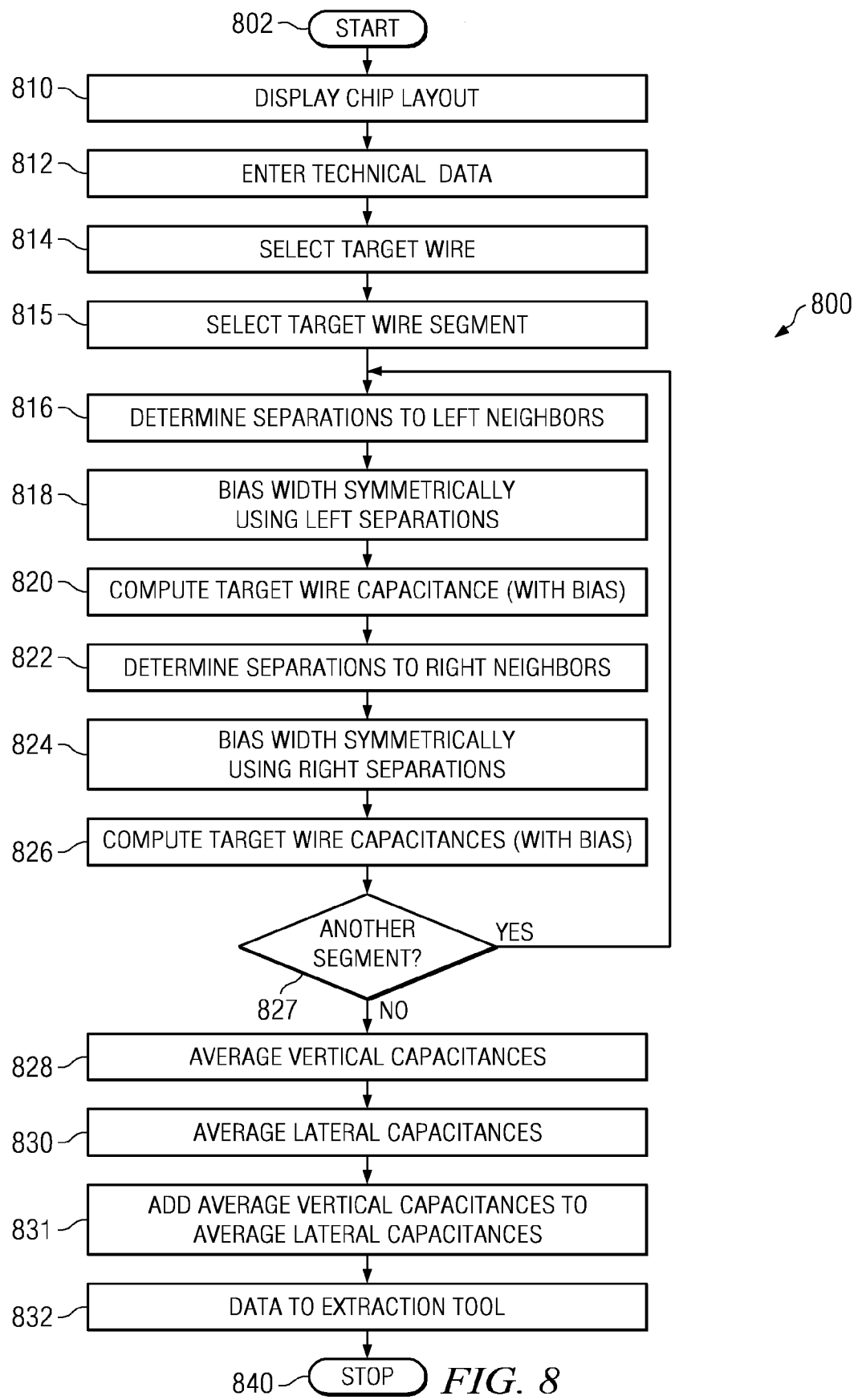
FIG. 8 is a flowchart of a capacitance correction algorithm.

FIG. 8 is a flowchart of capacitance module 800. Capacitance module 800 begins (step 802) and displays the chip layout (step 810). Technical data is entered (812), and the target wire shape is selected (step 814). A target wire shape segment is then selected (step 815). Separation distances from left neighbors are determined (step 816) and width is biased symmetrically using the left separations (step 818). Target wire shape resistances are computed with the bias (step 820). Next, separation distances are determined from the right neighbors (step 822). Width is biased symmetrically using the right neighbor separation distances (step 824). Target wire shape capacitances are computed with bias (step 826). A determination is made as to whether there is another segment (step 827). When there is another segment, capacitance module goes to step 816. When there is not another segment, vertical capacitances are averaged (step 828). Lateral capacitances are averaged (step 830). The average vertical capacitances and the average lateral capacitances are added (step 831). The data is sent to the DA application (step 832), and capacitance module 800 stops (step 840).

It is difficult to correct for the bias on the lateral neighbor wire shapes since their widths are also spacing-dependent and, for the reasons described above, both spacings of both wire shapes may be unknown simultaneously. A first order error will result in the application of the width-dependent bias based on assuming the spacing-dependent bias is applied to both sides of each wire shape. This error will be minimal if the width-dependent bias change is small with respect to the spacing-dependent bias change. The procedure presented above does not correct the lateral capacitance error to the second order of the Taylor series expansion as it does for the capacitances. It can also be shown that the resistance determined by the above process is also accurate to the first order of the Taylor series expansion, but the determination of resistance with full accuracy is not difficult since the two biases can be saved on the shape and the resistance easily determined after that time.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing a program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. An apparatus for calculating an approximate electrical performance value for a target wire shape, having a left neighbor and a right neighbor shape in a chip, when using a Design Automated Application (DA application) that is limited to determining one of two possible distances to a neighbor wire shape of the target wire shape at any one time, comprising:
   a computer connected to a memory and to a database; and
   a DA application and a Bias Calculation (BC) program in the memory;
   wherein the BC program contains a plurality of instructions to cause a processor of the computer to interact with the DA application and to:
      pass a scanline over the target wire shape to generate data;
      determine from the data, a first separation distance from the left neighbor;
      responsive to determining the first separation distance, biasing a width of the target wire shape symmetrically using the first separation distance to determine a first bias width;
      calculate, using the first bias width, a first electrical performance value for the target wire shape;
      determine, from the data, a second separation distance from the right neighbor;
      responsive to determining the second separation distance, bias the width of the target wire shape symmetrically using the second separation distance to determine a second bias width;
      calculate, using the second bias width, a second electrical performance value for the target wire shape;
      calculate the approximate electrical performance value by averaging the first value and the second value to obtain the approximate electrical performance value; and
      using the approximate electrical performance value to validate a design specification of the chip.

2. The apparatus of claim 1, when the electrical performance value is a resistance value, the plurality of instructions are adapted to cause the processor to perform steps comprising:

determining a first spacing-dependent full bias for a first side using a plurality of separations for one or more first side neighbor wire shapes, and using the first spacing-dependent full bias, computing a first target wire shape resistance;

determining a second spacing-dependent full bias for a second side using a plurality of second separations for one or more second side neighbor wire shapes, and using the second spacing-dependent full bias to compute a second target wire shape resistance;

calculating an approximate resistance value by averaging the first resistance value and the second resistance value; and using the approximate resistance value for a design validation.

3. The apparatus of claim 1, wherein when the electrical performance value is a capacitance value, the plurality of instructions are adapted to cause the processor to perform steps comprising:

calculating a first biased target wire shape capacitance by determining a first lateral capacitance, a first layer capacitance, and a second layer capacitance of a first neighbor on a first side of the target wire shape using a target wire shape width corrected with a first spacing-dependent full bias;

calculating a second biased target wire shape capacitance by determining a second lateral capacitance, a third layer capacitance to the first layer shape, and a fourth layer capacitance to the second layer shape of a second neighbor on a second side of the target wire shape using a second target wire shape width corrected with a second spacing-dependent full bias;

averaging the first layer capacitance, the second layer capacitance, the third layer capacitance and the fourth layer capacitance to get an approximate layer capacitance value;

averaging the first lateral capacitance value and the second lateral capacitance value to get an approximate lateral capacitance value; and using the sum of the approximate layer capacitance value and the approximate lateral capacitance value for design validation.

4. The apparatus of claim 1, further comprising:
wherein a plurality of first order errors cancel.

5. The apparatus of claim 1, further comprising:
wherein the approximate electrical value is calculated without an impact on a consumption of a memory or a performance resource caused by a simultaneous calculation of a full bias for both the first side and the second side of the target wire shape.

6. A computer implemented method comprising:
loading a Bias Calculation program (BC program) into a memory connected to a computer, the memory containing a Design Automated Software Application (DA application), the DA application limited to determining one of two possible distances to a neighbor wire shape of a target wire shape at any one time;

using the BC program, interfacing with the DA application, and causing a processor of the computer to perform steps comprising:
passing a scanline over the target wire shape to generate data;
determining from the data, a first separation distance from the left neighbor;
responsive to determining the first separation distance, biasing a width of the target wire shape symmetrically using the first separation distance to determine a first bias width;
calculating, using the first bias width, a first electrical performance value for the target wire shape;
determining, from the data, a second separation distance from the right neighbor;
responsive to determining the second separation distance, biasing the width of the target wire shape symmetrically using the second separation distance to determine a second bias width;
calculating, using the second bias width, a second electrical performance value for the target wire shape;
calculating an approximate electrical performance value for the target wire shape, by averaging the first electrical performance value and the second electrical performance value to obtain the approximate electrical performance value; and
using the approximate electrical performance value to validate a design specification of a chip.

7. The computer implemented method of claim 6, further comprising:
when the electrical performance value is a resistance value, causing the processor to perform steps comprising:
determining a first spacing-dependent full bias for a first side using a plurality of separations for one or more first side neighbor wire shapes, and using the first spacing-dependent full bias, computing a first target wire shape resistance;
determining a second spacing-dependent full bias for a second side using a plurality of second separations for one or more second side neighbor wire shapes, and using the second spacing-dependent full bias to compute a second target wire shape resistance;
calculating an approximate resistance value by averaging the first resistance value and the second resistance value; and
using the approximate resistance value for a design validation.

8. The computer implemented method of claim 6, wherein when the electrical performance value is a capacitance value, causing the computer to perform steps comprising:
calculating a first biased target wire shape capacitance by determining a first lateral capacitance, a first layer capacitance, and a second layer capacitance of a first neighbor on a first side of the target wire shape using a target wire shape width corrected with a first spacing-dependent bias;
calculating a second biased target wire shape capacitance by determining a second lateral capacitance, a third layer capacitance to the first layer shape, and a fourth layer capacitance to the second layer shape of a second neighbor on a second side of the target wire shape using a second target wire shape width corrected with a second spacing-dependent full bias;
averaging the first layer capacitance, the second layer capacitance, the third layer capacitance and the fourth layer capacitance to get an approximate layer capacitance value;
averaging the first lateral capacitance value and the second lateral capacitance value to get an approximate lateral capacitance value; and
using the sum of the approximate layer capacitance value and the approximate lateral capacitance value for design validation.

9. The computer implemented method of claim 6, further comprising:
wherein a plurality of first order errors cancel.

10. The computer implemented method of claim 6, further comprising:
wherein the approximate electrical value is calculated without an impact on a consumption of a memory or a performance resource caused by a simultaneous calculation of a full bias for both the first side and the second side of the target wire shape.

11. A computer program product comprising:
a non-transitory computer readable storage device, the computer readable storage device containing a plurality of instructions configured to cause a computer to perform steps comprising:
interfacing with a Design Automated Software Application (DA application) that is limited to determining one of two possible distances to a neighbor wire shape of the target wire shape at any one time;
passing a scanline over the target wire shape to generate data;
determining from the data, a first separation distance from the left neighbor;
responsive to determining the first separation distance, biasing a width of the target wire shape symmetrically using the first separation distance to determine a first bias width;
calculating, using the first bias width, a first electrical performance value for the target wire shape;
determining, from the data, a second separation distance from the right neighbor;
responsive to determining the second separation distance, biasing the width of the target wire shape symmetrically using the second separation distance to determine a second bias width;
calculating, using the second bias width, a second electrical performance value for the target wire shape; and
using the approximate electrical performance value to validate a design specification of a chip.

12. The computer program product of claim 11, further comprising:
when the electrical performance value is a resistance value, causing the processor to perform steps comprising:
determining a first spacing-dependent full bias for a first side using a plurality of separations for one or more first side neighbor wire shapes, and using the first spacing-dependent full bias, computing a first target wire shape resistance;
determining a second spacing-dependent full bias for a second side using a plurality of second separations for one or more second side neighbor wire shapes, and using the second spacing-dependent full bias to compute a second target wire shape resistance;
calculating an approximate resistance value by averaging the first resistance value and the second resistance value; and
using the approximate resistance value for a design validation.

13. The computer program product of claim 11, wherein when the electrical performance value is a capacitance value, causing the computer to perform steps comprising:
calculating a first biased target wire shape capacitance by determining a first lateral capacitance, a first layer capacitance, and a second layer capacitance of a first neighbor on a first side of the target wire shape using a target wire shape width corrected with a first spacing-dependent bias;
calculating a second biased target wire shape capacitance by determining a second lateral capacitance, a third layer capacitance to the first layer shape, and a fourth layer capacitance to the second layer shape of a second neighbor on a second side of the target wire shape using a second target wire shape width corrected with a second spacing-dependent full bias;
averaging the first layer capacitance, the second layer capacitance, the third layer capacitance and the fourth layer capacitance to get an approximate layer capacitance value;
averaging the first lateral capacitance value and the second lateral capacitance value to get an approximate lateral capacitance value; and
using the sum of the approximate layer capacitance value and the approximate lateral capacitance value for design validation.

14. The computer program product of claim 11, further comprising:
wherein a plurality of first order errors cancel.

15. The computer program product of claim 11, further comprising:
wherein the approximate electrical value is calculated without an impact on a consumption of a memory or a performance resource caused by a simultaneous calculation of a full bias for both the first side and the second side of the target wire shape.

* * * * *